(12) United States Patent
Nakayama et al.

(10) Patent No.: US 7,423,572 B2
(45) Date of Patent: Sep. 9, 2008

(54) DIGITAL-TO-ANALOG CONVERTER

(75) Inventors: Kurumi Nakayama, Osaka (JP); Yasuyuki Doi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/700,125

(22) Filed: Jan. 31, 2007

(65) Prior Publication Data
US 2007/0176813 A1 Aug. 2, 2007

(30) Foreign Application Priority Data
Jan. 31, 2006 (JP) ............... 2006-022188
Dec. 1, 2006 (JP) ............... 2006-325506

(51) Int. Cl.
H03M 1/68 (2006.01)
(52) U.S. Cl. ...................... 341/145; 341/148
(58) Field of Classification Search ............ 341/145, 341/148, 154; 345/77, 84, 692
See application file for complete search history.

(56) References Cited

U.S. PATENT DOCUMENTS

| 5,877,717 | A | * | 3/1999 | Tu et al. ............... 341/145 |
|---|---|---|---|---|
| 5,943,000 | A | * | 8/1999 | Nessi et al. ............... 341/154 |
| 5,969,657 | A | * | 10/1999 | Dempsey et al. ............ 341/145 |
| 6,373,419 | B1 | | 4/2002 | Nakao |
| 7,006,027 | B2 | | 2/2006 | Lan et al. |
| 7,250,889 | B2 | | 7/2007 | Lan et al. |
| 7,327,299 | B2 | * | 2/2008 | Yen et al. ............... 341/145 |
| 2002/0033763 | A1 | | 3/2002 | Nakao |
| 2005/0285767 | A1 | | 12/2005 | Wang et al. |
| 2006/0001627 | A1 | | 1/2006 | Murata |
| 2006/0023001 | A1 | | 2/2006 | Sung et al. |
| 2007/0247343 | A1 | | 10/2007 | Lan et al. |

* cited by examiner

*Primary Examiner*—Howard Williams
(74) *Attorney, Agent, or Firm*—McDermott Will & Emery LLP

(57) ABSTRACT

For example, in order to convert a 6-bit digital signal into an analog signal, a reference voltage generating circuit for generating 17 reference voltages, a first switch circuit having 19 switch pairs each including a MOS transistor for two reference voltages adjacent to each other in accordance with upper four bits, a second switch circuit including a series circuit of 12 MOS transistors and for dividing the difference between the two selected reference voltages using combined ON-resistances into four so as to obtain three intermediate voltages, and a third switch circuit for selectively outputting the lower voltage of the two selected reference voltages or one of the three intermediate voltages in accordance with lower two bits, are provided.

14 Claims, 15 Drawing Sheets

FIG. 3

| CONTROL SIGNAL | | SW2 | | | | SW3 | | | | Vout |
|---|---|---|---|---|---|---|---|---|---|---|
| bit1 | bit0 | M00 | M01 | M02 | M03 | M04 | M05 | M06 | M07 | |
| 0 | 0 | ※ | ※ | ※ | ※ | ON | OFF | OFF | OFF | Vn00=Vin1 |
| 0 | 1 | ON | ON | ON | ON | OFF | ON | OFF | OFF | Vn01=Vin1+(Vin2−Vin1)/4 |
| 1 | 0 | ON | ON | ON | ON | OFF | OFF | ON | OFF | Vn02=Vin1+(Vin2−Vin1)/2 |
| 1 | 1 | ON | ON | ON | ON | OFF | OFF | OFF | ON | Vn03=Vin1+3(Vin2−Vin1)/4 |

Vin1, Vin2: two adjacent voltages of V0 to V64
At least one of ※'s is OFF

FIG. 4

| CONTROL SIGNAL | | | | | | Vin1 | Vin2 | Vout |
|---|---|---|---|---|---|---|---|---|
| bit5 | bit4 | bit3 | bit2 | bit1 | bit0 | | | |
| 0 | 0 | 0 | 0 | 0 | 0 | V0 | V4 | V0 |
| 0 | 0 | 0 | 0 | 0 | 1 | V0 | V4 | V1 |
| 0 | 0 | 0 | 0 | 1 | 0 | V0 | V4 | V2 |
| 0 | 0 | 0 | 0 | 1 | 1 | V0 | V4 | V3 |
| 0 | 0 | 0 | 1 | 0 | 0 | V4 | V8 | V4 |
| 0 | 0 | 0 | 1 | 0 | 1 | V4 | V8 | V5 |
| 0 | 0 | 0 | 1 | 1 | 0 | V4 | V8 | V6 |
| 0 | 0 | 0 | 1 | 1 | 1 | V4 | V8 | V7 |
| ... | ... | ... | ... | ... | ... | ... | ... | ... |
| 1 | 1 | 1 | 0 | 1 | 1 | V56 | V60 | V56 |
| 1 | 1 | 1 | 0 | 0 | 0 | V56 | V60 | V57 |
| 1 | 1 | 1 | 0 | 0 | 1 | V56 | V60 | V58 |
| 1 | 1 | 1 | 0 | 1 | 0 | V56 | V60 | V59 |
| 1 | 1 | 1 | 1 | 0 | 0 | V60 | V64 | V60 |
| 1 | 1 | 1 | 1 | 0 | 1 | V60 | V64 | V61 |
| 1 | 1 | 1 | 1 | 1 | 0 | V60 | V64 | V62 |
| 1 | 1 | 1 | 1 | 1 | 1 | V60 | V64 | V63 |

FIG. 7

| NUMBER OF DIVISIONS | CONTROL SIGNAL | | SW2 | | | | | | SW3 | | | | | | | Vout |
|---|---|---|---|---|---|---|---|---|---|---|---|---|---|---|---|---|
| | bit1 | bit0 | M10 | M11 | M12 | M13 | M14 | M15 | M16 | M17 | M18 | M19 | M20 | M21 | M22 | |
| 4-WAY DIVISION | 0 | 0 | ※ | ※ | ※ | ※ | ※ | ※ | ON | OFF | OFF | OFF | OFF | OFF | OFF | Vn10=Vin1 |
| | 0 | 1 | ON | ON | ※ | ※ | ※ | ON | OFF | ON | OFF | OFF | OFF | OFF | OFF | Vn11=Vin1+(Vin2−Vin1)/4 |
| | 1 | 0 | ON | ON | ON | ON | ON | ON | OFF | OFF | ON | OFF | OFF | OFF | OFF | Vn13=Vin1+(Vin2−Vin1)/2 |
| | 1 | 1 | ON | ON | ON | ON | ON | ON | OFF | OFF | OFF | ON | OFF | OFF | OFF | Vn15=Vin1+3(Vin2−Vin1)/4 |
| 3-WAY DIVISION | 0 | 0 | ※ | ※ | ※ | ※ | ※ | ※ | ON | OFF | OFF | OFF | OFF | OFF | OFF | Vn10=Vin1 |
| | 0 | 1 | ※ | ※ | ※ | ※ | ON | ※ | OFF | OFF | OFF | OFF | ON | OFF | OFF | Vin1+(Vin2−Vin1)/3 |
| | 1 | 0 | ON | ON | ※ | ※ | ※ | ※ | OFF | OFF | OFF | OFF | OFF | ON | OFF | Vin1+2(Vin2−Vin1)/3 |
| | 1 | 1 | ※ | ※ | ※ | ※ | ※ | ※ | OFF | OFF | OFF | OFF | OFF | OFF | ON | Vn16 = Vin2 |

Vin1, Vin2: two adjacent voltages of V0 to V63
At least one of ※'s is OFF on each row

| NUMBER OF DIVISIONS | CONTROL SIGNAL | | | | | | Vin1 | Vin2 | Vout |
|---|---|---|---|---|---|---|---|---|---|
| | bit5 | bit4 | bit3 | bit2 | bit1 | bit0 | | | |
| 4-WAY DIVISION | 0 | 0 | 0 | 0 | 0 | 0 | V0 | V4 | V0 |
| | 0 | 0 | 0 | 0 | 0 | 1 | V0 | V4 | V1 |
| | 0 | 0 | 0 | 0 | 1 | 0 | V0 | V4 | V2 |
| | 0 | 0 | 0 | 0 | 1 | 1 | V0 | V4 | V3 |
| | 0 | 0 | 0 | 1 | 0 | 0 | V4 | V8 | V4 |
| | 0 | 0 | 0 | 1 | 0 | 1 | V4 | V8 | V5 |
| | 0 | 0 | 0 | 1 | 1 | 0 | V4 | V8 | V6 |
| | 0 | 0 | 0 | 1 | 1 | 1 | V4 | V8 | V7 |
| | ... | ... | ... | ... | ... | ... | ... | ... | ... |
| | 1 | 1 | 1 | 0 | 1 | 1 | V56 | V60 | V56 |
| | 1 | 1 | 1 | 0 | 0 | 0 | V56 | V60 | V57 |
| | 1 | 1 | 1 | 0 | 0 | 1 | V56 | V60 | V58 |
| | 1 | 1 | 1 | 0 | 1 | 0 | V56 | V60 | V59 |
| 3-WAY DIVISION | 1 | 1 | 1 | 1 | 0 | 0 | V60 | V63 | V60 |
| | 1 | 1 | 1 | 1 | 0 | 1 | V60 | V63 | V61 |
| | 1 | 1 | 1 | 1 | 1 | 0 | V60 | V63 | V62 |
| | 1 | 1 | 1 | 1 | 1 | 1 | V60 | V63 | V63 |

| CONTROL SIGNAL | | T3 | T2 | T1 | T0 |
|---|---|---|---|---|---|
| bit3 | bit2 | | | | |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

FIG. 14

| CONTROL SIGNAL | | SW6 | | |
|---|---|---|---|---|
| bit5 | bit4 | M32 | M31 | M30 |
| 0 | 0 | OFF | OFF | ON |
| 0 | 1 | OFF | ON | OFF |
| 1 | 0 | OFF | ON | OFF |
| 1 | 1 | ON | OFF | OFF |

FIG. 15

| CONTROL SIGNAL | | | | | | Vout |
|---|---|---|---|---|---|---|
| bit5 | bit4 | bit3 | bit2 | bit1 | bit0 | |
| 0 | 0 | 0 | 0 | 0 | 0 | V0 |
| 0 | 0 | 0 | 0 | 0 | 1 | V1 |
| 0 | 0 | 0 | 0 | 1 | 0 | V2 |
| 0 | 0 | 0 | 0 | 1 | 1 | V3 |
| 0 | 0 | 0 | 1 | 0 | 0 | V4 |
| 0 | 0 | 0 | 1 | 0 | 1 | V5 |
| 0 | 0 | 0 | 1 | 1 | 0 | V6 |
| 0 | 0 | 0 | 1 | 1 | 1 | V7 |
| 0 | 0 | 1 | 0 | 0 | 0 | V8 |
| 0 | 0 | 1 | 0 | 0 | 1 | V9 |
| 0 | 0 | 1 | 0 | 1 | 0 | V10 |
| 0 | 0 | 1 | 0 | 1 | 1 | V11 |
| 0 | 0 | 1 | 1 | 0 | 0 | V12 |
| 0 | 0 | 1 | 1 | 0 | 1 | V13 |
| 0 | 0 | 1 | 1 | 1 | 0 | V14 |
| 0 | 0 | 1 | 1 | 1 | 1 | V15 |

FIG. 16

| CONTROL SIGNAL | | | | | | Vout |
|---|---|---|---|---|---|---|
| bit5 | bit4 | bit3 | bit2 | bit1 | bit0 | |
| 0 | 1 | 0 | 0 | 0 | 0 | V16 |
| 0 | 1 | 0 | 0 | 0 | 1 | V17 |
| 0 | 1 | 0 | 0 | 1 | 0 | V18 |
| 0 | 1 | 0 | 0 | 1 | 1 | V19 |
| 0 | 1 | 0 | 1 | 0 | 0 | V20 |
| 0 | 1 | 0 | 1 | 0 | 1 | V21 |
| 0 | 1 | 0 | 1 | 1 | 0 | V22 |
| 0 | 1 | 0 | 1 | 1 | 1 | V23 |
| 0 | 1 | 1 | 0 | 0 | 0 | V24 |
| 0 | 1 | 1 | 0 | 0 | 1 | V25 |
| 0 | 1 | 1 | 0 | 1 | 0 | V26 |
| 0 | 1 | 1 | 0 | 1 | 1 | V27 |
| 0 | 1 | 1 | 1 | 0 | 0 | V28 |
| 0 | 1 | 1 | 1 | 0 | 1 | V29 |
| 0 | 1 | 1 | 1 | 1 | 0 | V30 |
| 0 | 1 | 1 | 1 | 1 | 1 | V31 |
| 1 | 0 | 0 | 0 | 0 | 0 | V32 |
| 1 | 0 | 0 | 0 | 0 | 1 | V33 |
| 1 | 0 | 0 | 0 | 1 | 0 | V34 |
| 1 | 0 | 0 | 0 | 1 | 1 | V35 |
| 1 | 0 | 0 | 1 | 0 | 0 | V36 |
| 1 | 0 | 0 | 1 | 0 | 1 | V37 |
| 1 | 0 | 0 | 1 | 1 | 0 | V38 |
| 1 | 0 | 0 | 1 | 1 | 1 | V39 |
| 1 | 0 | 1 | 0 | 0 | 0 | V40 |
| 1 | 0 | 1 | 0 | 0 | 1 | V41 |
| 1 | 0 | 1 | 0 | 1 | 0 | V42 |
| 1 | 0 | 1 | 0 | 1 | 1 | V43 |
| 1 | 0 | 1 | 1 | 0 | 0 | V44 |
| 1 | 0 | 1 | 1 | 0 | 1 | V45 |
| 1 | 0 | 1 | 1 | 1 | 0 | V46 |
| 1 | 0 | 1 | 1 | 1 | 1 | V47 |

FIG. 17

| CONTROL SIGNAL | | | | | | Vout |
|---|---|---|---|---|---|---|
| bit5 | bit4 | bit3 | bit2 | bit1 | bit0 | |
| 1 | 1 | 0 | 0 | 0 | 0 | V48 |
| 1 | 1 | 0 | 0 | 0 | 1 | V49 |
| 1 | 1 | 0 | 0 | 1 | 0 | V50 |
| 1 | 1 | 0 | 0 | 1 | 1 | V51 |
| 1 | 1 | 0 | 1 | 0 | 0 | V52 |
| 1 | 1 | 0 | 1 | 0 | 1 | V53 |
| 1 | 1 | 0 | 1 | 1 | 0 | V54 |
| 1 | 1 | 0 | 1 | 1 | 1 | V55 |
| 1 | 1 | 1 | 0 | 0 | 0 | V56 |
| 1 | 1 | 1 | 0 | 0 | 1 | V57 |
| 1 | 1 | 1 | 0 | 1 | 0 | V58 |
| 1 | 1 | 1 | 0 | 1 | 1 | V59 |
| 1 | 1 | 1 | 1 | 0 | 0 | V60 |
| 1 | 1 | 1 | 1 | 0 | 1 | V61 |
| 1 | 1 | 1 | 1 | 1 | 0 | V62 |
| 1 | 1 | 1 | 1 | 1 | 1 | V63 |

US 7,423,572 B2

DIGITAL-TO-ANALOG CONVERTER

BACKGROUND OF THE INVENTION

1. Field of the Invention

The present invention relates to a digital-to-analog converter (DAC), and more particularly to, a DAC suitably used in particularly an image display apparatus, such as a liquid crystal display or the like.

2. Description of the Related Art

As a conventional DAC for a liquid crystal display, there is a known DAC which has a reference voltage generating circuit, a selection circuit having a plurality of switch pairs, and a voltage follower. Specifically, when the DAC receives a 6-bit digital signal as an input code, the reference voltage generating circuit comprises 32 resistance elements which are connected in series, and supplies 33 reference voltages different from each other to the selection circuit from the terminals of the respective resistance elements. The selection circuit comprises 37 switch pairs each of which selects one of two inputs in accordance with a corresponding bit of the input code. If the input code is odd, two reference voltages adjacent to each other are selected from the 33 reference voltages. If the input code is even, one reference voltage is duplicately selected from the 33 reference voltages. These voltages are supplied to the voltage follower. The voltage follower outputs an average value of the two supplied voltages as an analog signal. In other words, when the input code is odd, an intermediate voltage between two adjacent reference voltages is generated by the voltage follower (see U.S. Pat. No. 6,373,419).

In the conventional DAC above, as the number of input bits (resolution) is increased from 6 to 8 or 10, the number of reference voltages to be generated is dramatically increased from 33 to 129 or 513, so that the number of switch pairs required for the selection circuit is increased from 37 to 135 or 521.

In view of the current trend toward a higher resolution and a larger number of gray levels for liquid crystal displays, the chip size of the DAC needs to be increased when the conventional technique above is used.

SUMMARY OF THE INVENTION

An object of the present invention is to reduce the number of elements of a DAC while keeping the same resolution.

To achieve the object, in the present invention, an intermediate voltage is generated by dividing a voltage using an ON-resistance of a MOS (metal-oxide-semiconductor) transistor.

Specifically, the present invention provides a converter for converting a digital signal having N bits (N is an integer of 3 or more) into an analog signal using a plurality of reference voltages different from each other, comprising a selective voltage dividing circuit and a output circuit as follows. The selective voltage dividing circuit has a plurality of MOS transistors functioning as switches, and selects two reference voltages of the plurality of reference voltages via the same number of MOS transistors of the plurality of MOS transistors in accordance with upper (N−m) bits of the digital signal, and dividing a difference between the two selected reference voltages into M using combined ON-resistances of M MOS transistor groups connected in series to each other of the plurality of MOS transistors to obtain (M−1) intermediate voltages, wherein M is any one of integers from $2^m$ to $2^{m-1}+1$ where m is an integer of 1 or more. The output circuit selectively outputs one of the two selected reference voltages or one of the (M−1) intermediate voltages in accordance with lower m bits of the digital signal.

The converter may further comprise a reference voltage generating circuit for generating the plurality of reference voltages. In this case, the reference voltage generating circuit has $2^{N-m}$ resistance elements connected in series to each other, and supplies $(2^{N-m}+1)$ reference voltages different from each other from terminals of the resistance elements to the selective voltage dividing circuit.

When the selective voltage dividing circuit has a switch circuit for selecting two reference voltages adjacent to each other from the plurality of reference voltages, the switch circuit has, for example, a plurality of switch pairs each for selecting one of two inputs in accordance with a corresponding bit of upper (N−m) bits of the digital signal, and the number of switch pairs an corresponding to an n-th bit counted from the lowest bit of the upper (N−m) bits of the digital signal is given by:

$$a_1 = 2 \text{ and } a_n = a_{n-1} + 2^{n-2} (2 \leq n \leq N-m).$$

The two reference voltages adjacent to each other are each selected via (N−m) MOS transistors of the MOS transistors constituting the plurality of switch pairs. In this case, the M MOS transistor groups of the selective voltage dividing circuit each have (N−m+1) MOS transistors connected in series to each other. Two of the M MOS transistor groups each include (N−m) MOS transistors for selecting the two reference voltages adjacent to each other in the (N−m+1) MOS transistors connected in series to each other.

Also, when the selective voltage dividing circuit has a switch circuit for selecting two reference voltages adjacent to each other from the plurality of reference voltages, the selective voltage dividing circuit further has a decoding circuit for decoding lower P bits of upper (N−m) bits of the digital signal into $2^P$ selection signals any one of which is valid, where P is an integer of 2 or more and (N−m) or less. For example, the switch circuit has $2^P$ switch pairs each for selectively transferring two inputs to two outputs in accordance with a corresponding one of the $2^P$ selection signals, and a plurality of other switch pairs each for selecting one of two inputs in accordance with a corresponding one of upper (N−m−P) bits of the digital signal. The two reference voltages adjacent to each other are selected via (N−m−P+1) MOS transistors of the MOS transistors constituting all of the switch pairs. In this case, for example, each of the M MOS transistor groups in the selective voltage dividing circuit has (N−m−P+2) MOS transistors connected in series to each other. Two of the M MOS transistor groups each include (N−m−P+1) MOS transistors for selecting the two reference voltages adjacent to each other, of the (N−m−P+2) MOS transistors connected in series to each other.

BRIEF DESCRIPTION OF THE DRAWINGS

FIG. 3 is a diagram illustrating operations of second and third switch circuits of FIG. 2.

FIG. 4 is a diagram illustrating the whole operation of the DAC of FIG. 2.

FIG. 7 is a diagram illustrating operations of second and third switch circuits of FIG. 6.

FIG. 14 is a diagram illustrating an operation of a sixth switch circuit of FIG. 13.

FIG. 15 is a diagram illustrating a contribution of a fifth switch circuit in the whole operation of the DAC of FIG. 13.

FIG. 16 is a diagram illustrating a contribution of a combination switch circuit in the whole operation of the DAC of FIG. 13.

FIG. 17 is a diagram illustrating a contribution of a fourth switch circuit in the whole operation of the DAC of FIG. 13.

DETAILED DESCRIPTION OF THE PREFERRED EMBODIMENTS

Hereinafter, best-mode embodiments of the present invention will be described with reference to the accompanying drawings.

Figure 1:
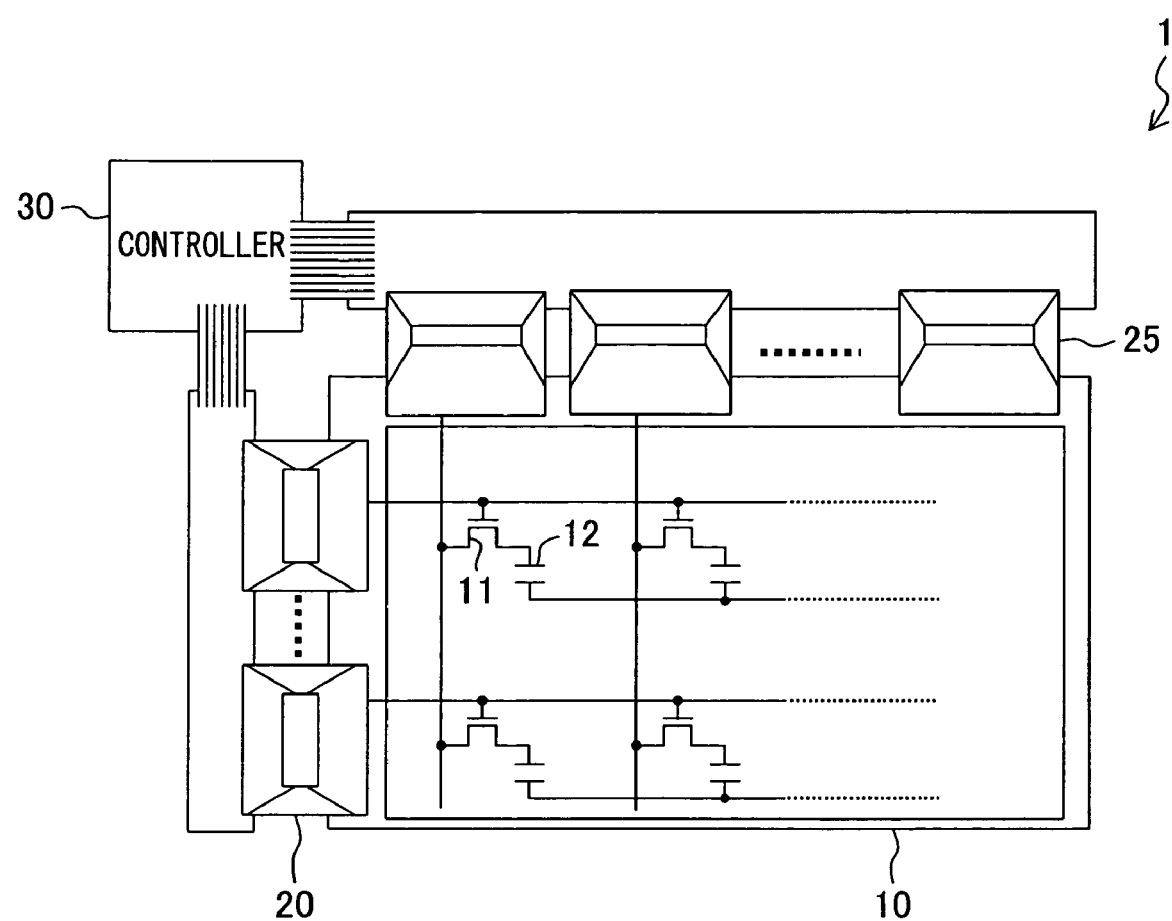
FIG. 1 is a schematic plan view of an image display apparatus which employs a DAC according to the present invention.

FIG. 1 is a schematic plan view of an image display apparatus which employs a DAC according to the present invention. The image display apparatus 1 of FIG. 1, which is a liquid crystal display, comprises a liquid crystal display panel 10 having a plurality of pixels arranged in a matrix, a plurality of gate drivers 20, a plurality of source drivers 25, and a controller 30 for controlling the gate drivers 20 and the source drivers 25. Each pixel of the liquid crystal display panel 10 has a thin film transistor (TFT) 11, and a pixel capacitor 12 connected to the drain of the TFT 11. The gates of TFTs 11 of pixels on the same row are driven by a common gate driver 20. The sources of TFTs 11 of pixels on the same column are driven by a common source driver 25. All the source drivers 25 constitute a liquid crystal driving circuit which drives a plurality of pixels in accordance with a digital signal indicating a gray level of an image transferred from the controller 30. Each source driver 25 includes a DAC for converting a digital signal into an analog signal for a corresponding pixel column. In other words, the image display apparatus 1 comprises DACs the number of which is the same as the number of pixel columns.

Figure 2:
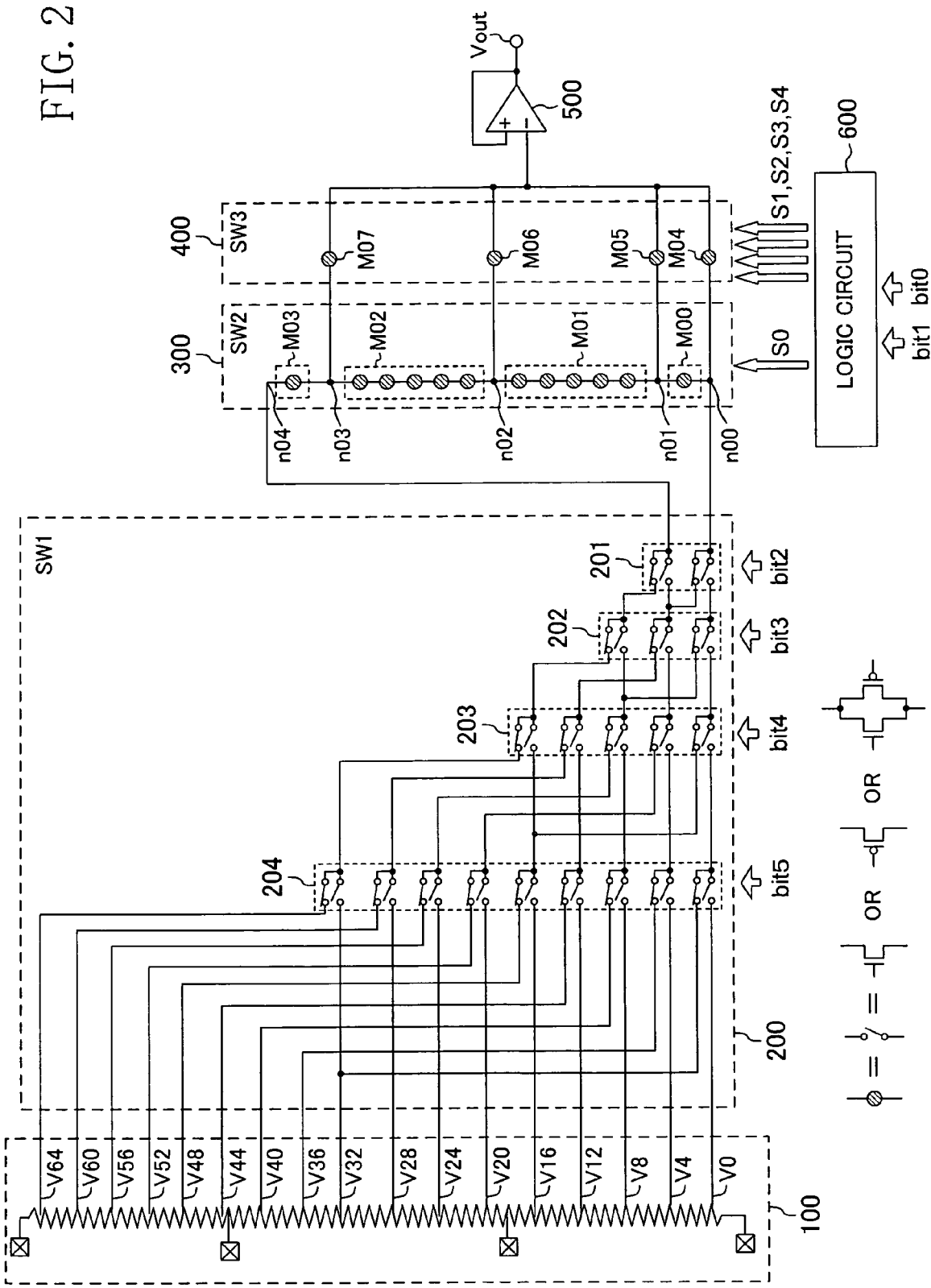
FIG. 2 is a circuit diagram illustrating an exemplary configuration of the DAC of the present invention.

FIG. 2 illustrates an exemplary configuration of the DAC of the present invention. The DAC of FIG. 2 is a converter for converting a digital signal represented by six bits (bit5 to bit0) into an analog signal Vout. The DAC comprises a reference voltage generating circuit 100, a first switch circuit (SW1) 200, a second switch circuit (SW2) 300, a third switch circuit (SW3) 400, a voltage follower 500, and a logic circuit 600.

The reference voltage generating circuit 100 is a resistance voltage dividing circuit which comprises 16(=$2^{6-2}$) resistance elements connected in series to each other. From the terminals of the resistance elements, 17 reference voltages V0, V4, V8, . . . , and V64 are supplied to the first switch circuit 200.

The first switch circuit 200 is a circuit for selecting two reference voltages adjacent to each other (hereinafter, the lower one is represented by Vin1, and the higher one is represented by Vin2), from the 17 reference voltages V0 to V64. The first switch circuit 200 receives upper four bits (bit5 to bit0) of the 6-bit digital signal, as a control signal. In FIG. 2, 201 indicates two switch pairs which are controlled ON/OFF using bit2. 202 indicates 3 (=$2+2^{2-2}$) switch pairs which are controlled ON/OFF using bit3. 203 indicates 5 (=$3+2^{3-2}$) switch pairs which are controlled ON/OFF using bit4. 204 indicates 9 (=$5+2^{4-2}$) switch pairs which are controlled ON/OFF using bit5. As described above. The first switch circuit 200 comprises nineteen 2-input 1-output switch pairs each of which selects one of two inputs in accordance with a corresponding bit of bit5 to bit2. Each switch pair selects the lower input when the corresponding bit is 0, and the upper input when the corresponding bit is 1.

Note that two switches constituting each switch pair in the first switch circuit 200 are each an N-channel MOS transistor or a P-channel MOS transistor or a transfer gate obtaining by combining these transistors. Note that it is hereinafter assumed that each switch is a P-channel MOS transistor (hereinafter simply referred to as a MOS transistor).

For example, if the four bits (bit5 to bit2) are "0000", the lowest reference voltage V0 is connected via 4 (=6−2) MOS transistors to the second switch circuit 300, and the next lowest reference voltage V4 is connected via 4(=6−2) other MOS transistors to the second switch circuit 300. In this case, Vin1=V0 and Vin2=V4. If the four bits (bit5 to bit2) are "0001", the reference voltage V4 is connected via 4 MOS transistors to the second switch circuit 300, and the next higher reference voltage V8 is connected via 4 other MOS transistors to the second switch circuit 300. In this case, Vin1=V4 and Vin2=V8. If the four bits (bit5 to bit2) are "1111", the reference voltage V60 is connected via four MOS transistors to the second switch circuit 300, and the highest reference voltage V64 is connected via 4 other MOS transistors to the second switch circuit 300. In this case, Vin1=V60 and Vin2=V64.

Sixteen circles illustrated in the second switch circuit 300 and the third switch circuit 400 each represent an N-channel MOS transistor or a P-channel MOS transistor or a transfer gate obtained by combining these transistors, which functions as a switch. Note that it is hereinafter assumed that each switch is a P-channel MOS transistor (hereinafter simply referred to as a MOS transistor).

The second switch circuit 300 comprises one MOS transistor M00 connected between a node n00 and a node n01, 5 (=6−2+1) MOS transistors M01 connected in series between the node n01 and a node n02, 5 (=6−2+1) MOS transistors M02 connected in series between the node n02 and a node n03, and one MOS transistor M03 between the node n03 and a node n04. The voltage Vin1 which is the lower one of the two reference voltages selected by the first switch circuit 200 is connected to the node n00, while the higher voltage Vin2 is connected to the node n04. Therefore, for example, when the four bits (bit5 to bit2) are "0000", and all of M00, M01, M02 and M03 are ON, a group of five ON-state MOS transistors is present between the reference voltage V0 and the node n01, between the node n01 and the node n02, between the node n02 and the node n03, and between the node n03 and the reference voltage V4. Combined ON-resistances of these four MOS transistor groups connected in series to each other divide the difference between V0 and V4 into four, resulting in three intermediate voltages. Note that the MOS transistor group between the reference voltage V0 and the node n01 includes four MOS transistors in the first switch circuit 200, and the MOS transistor group between the node n03 and the reference voltage V4 includes four other MOS transistors in the first switch circuit 200.

Also, when all 20 MOS transistors constituting the four MOS transistor groups have the same size, the four MOS transistor groups have the same combined ON-resistance. Therefore, an intermediate voltage V0+(V4−V0)/4 is obtained at the node n01, an intermediate voltage V0+(V4−V0)/2 is obtained at the node n02, and an intermediate voltage V0+3(V4−V0)/4 is provided at the node n03. Note that, in order to cause the voltage of the node n00 to be equal to the reference voltage V0, at least one of M00, M01, M02 and M03 is switched OFF so as to prevent a current from flowing through the four MOS transistor groups connected in series to each other.

The third switch circuit 400 comprises one MOS transistor M04 connected between the node n00 and an input node of the voltage follower 500, one MOS transistor M05 connected between the node n01 and the input node of the voltage follower 500, one MOS transistor M06 between the node n02 and the input node of the voltage follower 500, and one MOS transistor M07 connected between the node n03 and the input node of the voltage follower 500.

The logic circuit 600 generates a signal S0 for controlling the second switch circuit 300 and signals S1, S2, S3 and S4 for controlling ON/OFF of M04, M05, M06 and M07 in the third switch circuit 400, respectively, in accordance with lower bits (bit1 and bit0) of the 6-bit digital signal. As a result, the third switch circuit 400 selects the voltage of any one node of the four nodes n00, n01, n02 and n03 in accordance with bit1 and bit0, and supplies the selected voltage to the voltage follower 500. Thus, the voltage selected by the third switch circuit 400 is output as the analog signal Vout from the voltage follower 500.

FIG. 3 illustrates operations of the second and third switch circuits 300 and 400 of FIG. 2. FIG. 4 illustrates the whole operation of the DAC of FIG. 2. In FIG. 3, Vn00, Vn01, Vn02 and Vn03 are the voltages of the nodes n00, n01, n02 and n03. In the second switch circuit 300, for example, M01, M02 and M03 are set to be invariably ON, and ON/OFF of only M00 is controlled in accordance with the signal S0 corresponding to two bits (bit1 and bit0). When M05 and M07 have the same size, an intermediate voltage (corresponding to Vn02) between Vn01 and Vn03 can be generated by dividing the difference between Vn01 and Vn03 into two using the ON-resistances of M05 and M07 instead of selecting Vn02 at M06. In FIG. 4, V1, V2, V3, V5, V6, V7 and the like are intermediate voltages generated by the first and second switch circuits 200 and 300.

Figure 5:
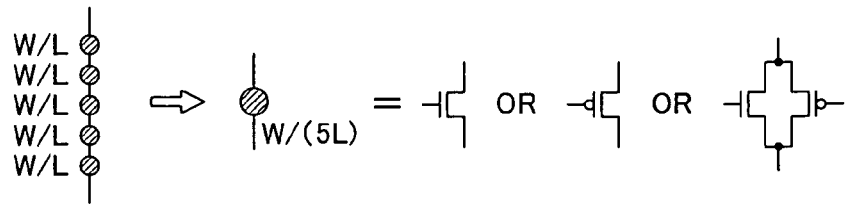
FIG. 5 is a conceptual diagram illustrating a variation of the second switch circuit of FIG. 2.

FIG. 5 illustrates a variation of the second switch circuit 300 of FIG. 2. Here, a size of a MOS transistor is represented by a ratio of a gate width W and a gate length L thereof (W/L). For example, when each of the five MOS transistors constituting M01 of FIG. 2 has a size of W/L, a series circuit of these five MOS transistors can be replaced with a single MOS transistor. Note that the latter MOS transistor has a size of W/(5L), and an ON-resistance equal to that of the series circuit of the five MOS transistors. Five MOS transistors constituting M02 of FIG. 2 can be similarly replaced with a single MOS transistor.

As described above, according to the DAC of FIG. 2, the first and second switch circuits 200 and 300 operate as the selective voltage dividing circuit above. Therefore, when the number of input bits is 6, the number of reference voltages to be generated is 17, and the number of switch pairs required for the first switch circuit 200 operating as a selection circuit is 19. Therefore, even taking into account elements required for the second and third switch circuits 300 and 400 and the logic circuit 600, the number of elements required for the whole DAC can be reduced while keeping the same resolution, as compared to the conventional DAC above. In addition, this effect becomes further significant as the number of input bits (resolution) is increased from 6 to 8 or 10.

Note that the same number of MOS transistors may be added and connected in series to each of the four MOS transistor groups. By increasing the number of MOS transistors constituting each of the four MOS transistor groups, the combined ON-resistance of each MOS transistor group is increased, resulting in more correct intermediate voltages at nodes n01, n02 and n03.

Figure 6:
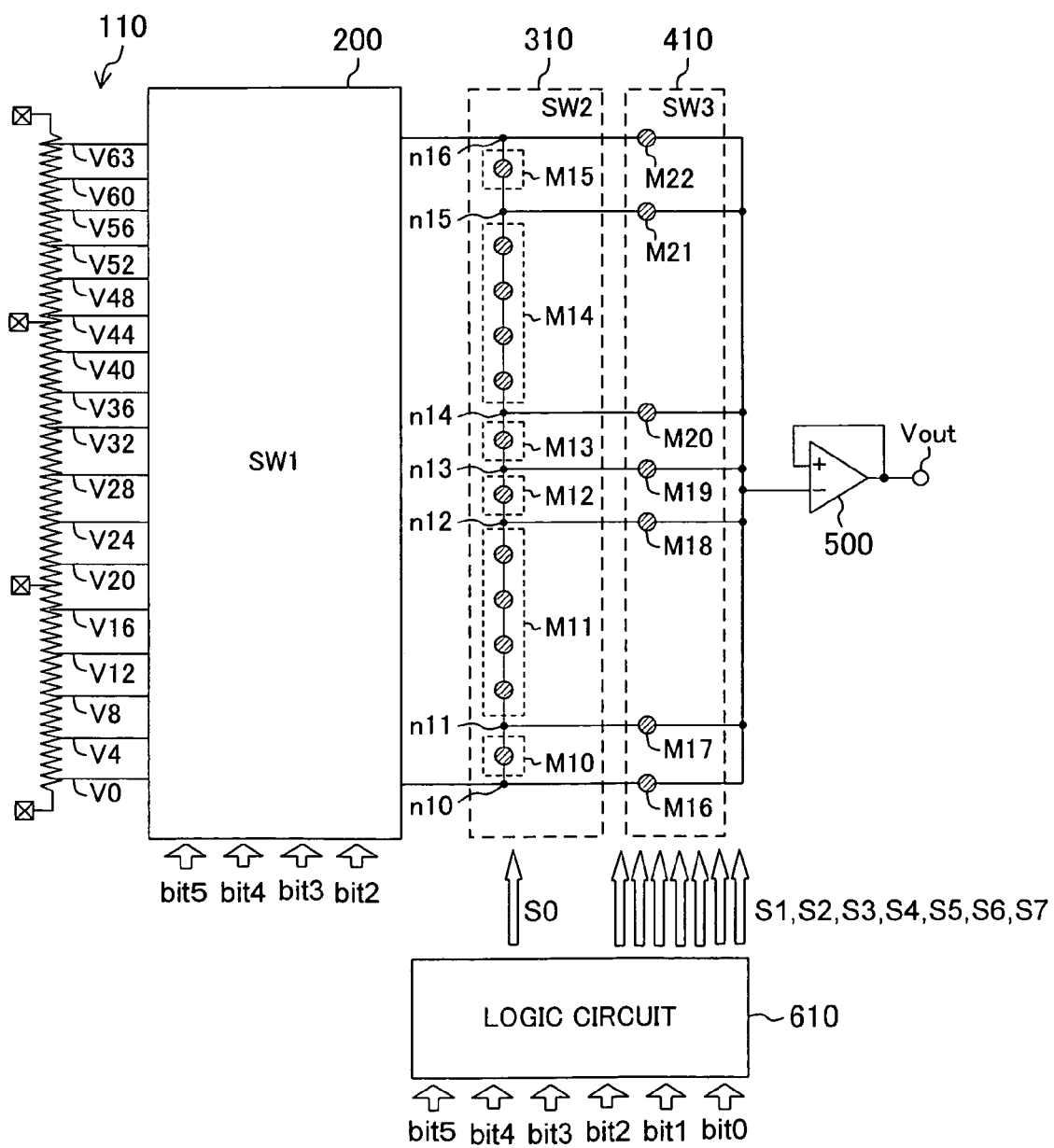
FIG. 6 is a circuit diagram illustrating another exemplary configuration of the DAC of the present invention.

FIG. 6 illustrates another exemplary configuration of the DAC of the present invention. The DAC of FIG. 6 is a converter for converting a digital signal represented by six bits (bit5 to bit0) into an analog signal Vout. The DAC comprises a reference voltage generating circuit 110, a first switch circuit (SW1) 200, a second switch circuit (SW2) 310, a third switch circuit (SW3) 410, a voltage follower 500, and a logic circuit 610. The DAC is characterized in that the difference between two reference voltages V60 and V63 selected by the first switch circuit 200 can be divided into three, and the largest reference voltage V63 can be output as an analog voltage Vout.

The reference voltage generating circuit 110 is a resistance voltage dividing circuit which comprises 16 ($=2^{6-2}$) resistance elements connected in series to each other. From the terminals of the resistance elements, 17 reference voltages V0, V4, V8, ..., V60 and V63 are supplied to the first switch circuit 200. The first switch circuit 200 has the same configuration as that which has been described in FIG. 2.

The second switch circuit 310 comprises one MOS transistor M10 connected between a node n10 and a node n11, four MOS transistors M11 connected in series between the node n11 and a node n12, one MOS transistor M12 connected between the node n12 and a node n13, one MOS transistor M13 connected between the node n13 and a node n14, four MOS transistors M14 connected in series between the node n14 and a node n15, and one MOS transistor M15 connected between the node n15 and a node n16. The voltage Vin1 which is the lower one of the two reference voltages selected by the first switch circuit 200 is connected to the node n10, while the higher voltage Vin2 is connected to the node n16. Here, M10 corresponds to M00 of FIG. 2, M11 and M12 correspond to M01 of FIG. 2. M13 and M14 correspond to M02 of FIG. 2, and M15 corresponds to M03 of FIG. 2.

The third switch circuit 410 comprises one MOS transistor M16 connected between the node n10 and an input node of the voltage follower 500, one MOS transistor M17 connected between the node n11 and the input node of the voltage follower 500, one MOS transistor M18 connected between the node n12 and the input node of the voltage follower 500, one MOS transistor M19 connected between the node n13 and the input node of the voltage follower 500, one MOS transistor M20 connected between the node n14 and the input node of the voltage follower 500, one MOS transistor M21 connected between the node n15 and the input node of the voltage follower 500, and one MOS transistor M22 between the node n16 and the input node of the voltage follower 500. Here, M16 corresponds to M04 of FIG. 2, M17 corresponds to M05 of FIG. 2, M19 corresponds to M06 of FIG. 2, and M21 corresponds to M07 of FIG. 2.

The logic circuit 610 generates a signal SO for controlling the second switch circuit 310 and signals S1, S2, S3, S4, S5, S6 and S7 for controlling ON/OFF of respective M16, M17, M18, M19, M20, M21 and M22 in the third switch circuit 410 in accordance with a 6-bit digital signal (bit5 to bit0).

FIG. 7 illustrates operations of the second and third switch circuits 310 and 410 of FIG. 6. An operation of dividing the difference between the two reference voltages Vin1 and Vin2 selected by the first switch circuit 200 into four is similar to that which has been described in FIG. 3, and will not be described. An operation of dividing the difference between the two reference voltages Vin1 (=V60) and Vin2 (=V63) into three will be described below.

Firstly, Vout=V60+(V63−V60)/3 is obtained as follows. In the second switch circuit 310, M14 and M15 are switched ON and at least one of M10 to M13 is switched OFF, while in the third switch circuit 410, M16 and M20 are switched ON and M17, M18, M19, M21 and M22 are switched OFF. Thereby, a group of five ON-state MOS transistors is present between the reference voltage V60 and the input node of the voltage follower 500 (via the node n10), between the input node of the voltage follower 500 and the node n15 (via the node n14), and between the node n15 and the reference voltage V63 (via the node n16). Therefore, the combined ON-resistances of these three MOS transistor groups connected in series divide the difference between V60 and V63 into three, thereby obtaining Vout=V60+(V63−V60)/3.

Next, Vout=V60+2(V63−V60)/3 is obtained as follows. In the second switch circuit 310, M10 and M11 are switched ON and at least one of M12 to M15 is switched OFF, while in the third switch circuit 410, M18 and M22 are switched ON and M16, M17, M19, M20 and M21 are switched OFF. Thereby, a group of five ON-state MOS transistors is present between the reference voltage V60 and the node n11 (via the node n10), between the node n11 and the input node of the voltage follower 500 (via the node n12), and between the input node of the voltage follower 500 and the reference voltage V63 (via the node n16). Therefore, the combined ON-resistances of these three MOS transistor groups connected in series divide the difference between V60 and V63 into three, thereby obtaining Vout=V60+2(V63−V60)/3.

If only M16 of M16 to M22 is switched ON under a condition that at least one of M10 to M15 is switched OFF, Vout=V60 is obtained. If only M22 of M16 to M22 is switched ON under that condition, Vout=V63 is obtained.

In FIG. 7, Vn10, Vn11, Vn13, Vn15 and Vn16 are voltages at the nodes n10, n11, n13, n15 and n16, respectively. In the second switch circuit 310, for example, M10, M11, M13, M14 and M15 may be set to be invariably ON, and only M12 may be controlled ON/OFF in accordance with the signal S0 corresponding to two bits (bit1 and bit0).

Figures 8, 9:
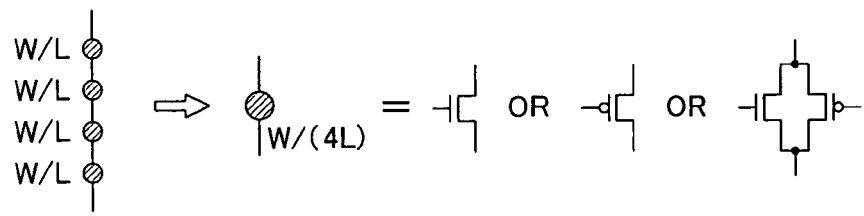
FIG. 8 is a diagram illustrating the whole operation of the DAC of FIG. 6.
FIG. 9 is a conceptual diagram illustrating a variation of the second switch circuit of FIG. 6.

FIG. 8 illustrates the whole operation of the DAC of FIG. 6. In this example, if four bits (bit5 to bit2) are "1111", the operation of dividing a voltage into three is performed, and if otherwise, the operation of dividing a voltage into four is executed. In FIG. 8, V1, V2, V3, V61, V62 and the like are intermediate voltages generated by the first, second and third switch circuits 200, 310 and 410.

FIG. 9 illustrates a variation of the second switch circuit 310 of FIG. 6. Specifically, four MOS transistors (M11 and/or M14 of FIG. 6) each having a size of W/L can be replaced with a single MOS transistor having a size of W/(4 L).

As described above, according to the DAC of FIG. 6, the operation of dividing a voltage into three can be achieved by the first, second and third switch circuits 200, 310 and 410 operating as the selective voltage dividing circuit above.

Figure 10:
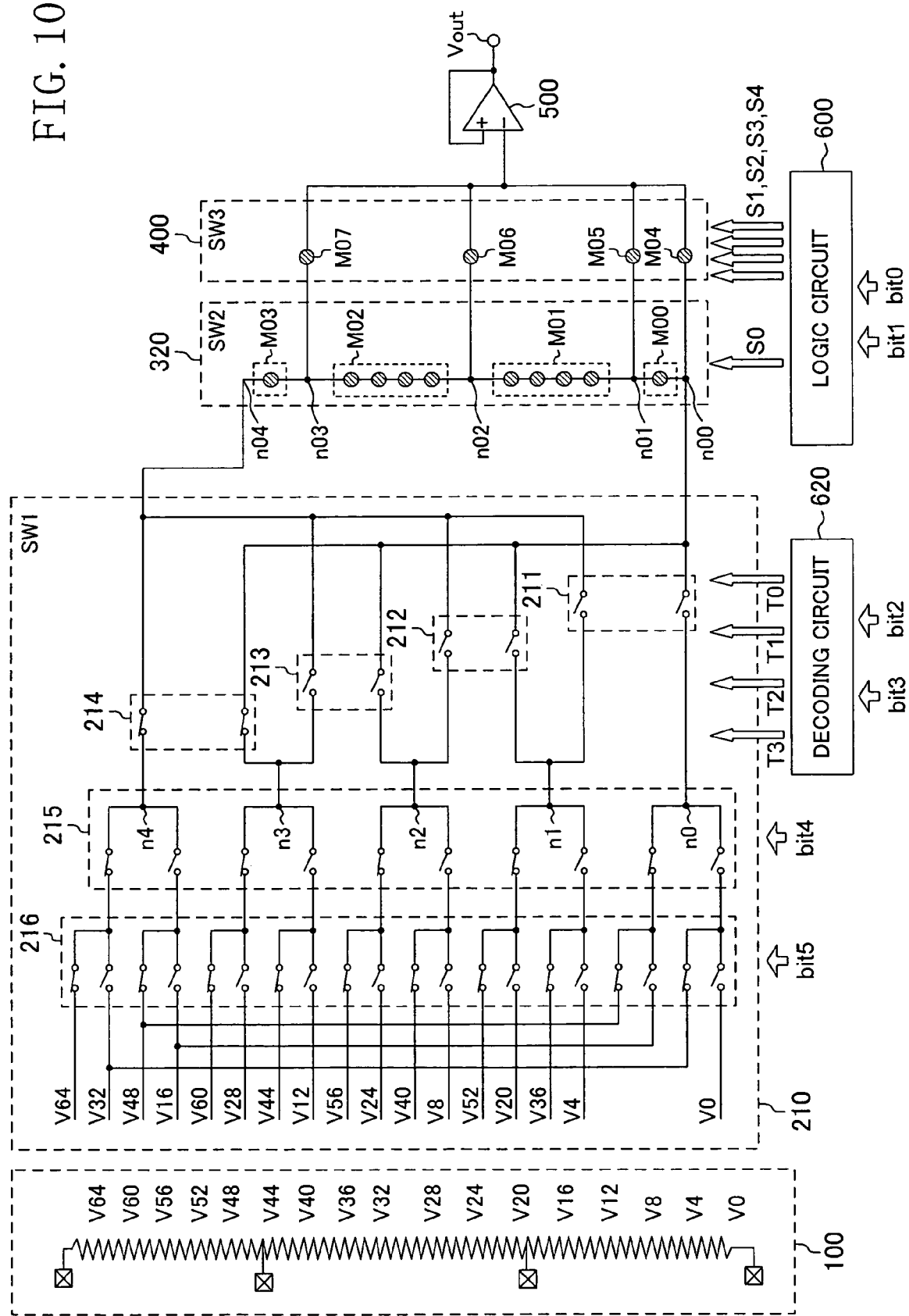
FIG. 10 is a circuit diagram illustrating still another exemplary configuration of the DAC of the present invention.

FIG. 10 illustrates still another exemplary configuration of the DAC of the present invention. The DAC of FIG. 10 is a converter for converting a digital signal represented by six bits (bit5 to bit0) into an analog signal Vout. The DAC comprises a reference voltage generating circuit 100, a first switch circuit (SW1) 210, a second switch circuit (SW2) 320, a third switch circuit (SW3) 400, a voltage follower 500, a logic circuit 600, and a decoding circuit 620. The DAC is characterized by a configuration of the first switch circuit 210.

The reference voltage generating circuit 100 has the same configuration as that which has been described in FIG. 2. The reference voltage generating circuit 100 supplies 17 reference voltages V0, V4, V8, . . . , and V64 different from each other to the first switch circuit 210.

Figures 11, 12:
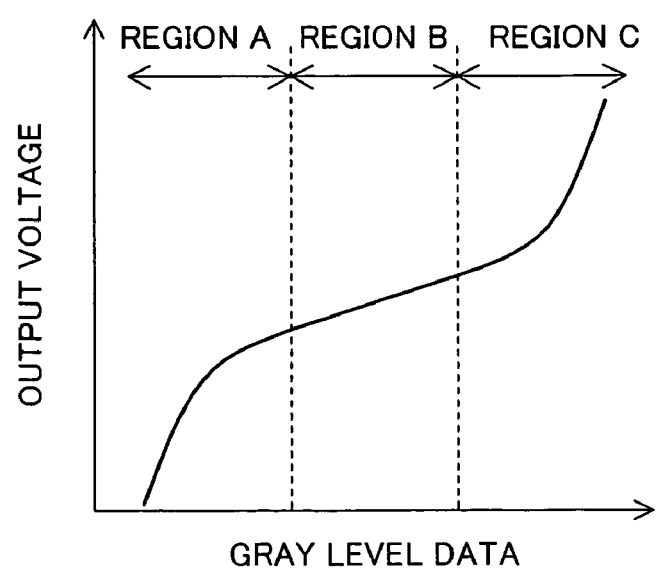
FIG. 11 is a diagram illustrating an operation of a decoding circuit of FIG. 10.
FIG. 12 is a diagram illustrating exemplary input-output characteristics of the DAC included in each source driver of FIG. 1.

The decoding circuit 620 decodes lower two bits (bit3 and bit2) of the upper four bits of the 6-bit digital signal into 4 (=$2^2$) selection signals T3, T2, T1 and T0 any one of which is valid (logic value: 1). FIG. 11 illustrates an operation of the decoding circuit 620.

The first switch circuit 210 is a circuit for selecting two reference voltages (hereinafter, the lower one is represented by Vin1, and the higher one is represented by Vin2) adjacent to each other, from the 17 reference voltages V0 to V64. The first switch circuit 210 receives upper two bits (bit5 to bit4) of the 6-bit digital signal and the selection signals T3, T2, T1 and T0 from the decoding circuit 620 as a control signal. 211 indicates one switch pair which is controlled ON/OFF using T0, and when T0=1, transfers two inputs (voltages at the nodes n0 and n1) to two outputs. 212 indicates one switch pair which is controlled ON/OFF using T1, and when T1=1, transfers two inputs (voltages at the nodes n1 and n2) to two outputs. 213 indicates one switch pair which is controlled ON/OFF using T2, and when T2=1, transfers two inputs (voltages at the nodes n2 and n3) to two outputs. 214 indicates one switch pair which is controlled ON/OFF using T3, and when T3=1, transfers two inputs (voltages at the nodes n3 and n4) to two outputs. These 4 (=$2^2$) switch pairs 211 to 214 each selectively transfer two inputs to two outputs in accordance with a corresponding selection signal of the four selection signals T3, T2, T1 and T0 from the decoding circuit 620. The upper outputs of the switch pairs are connected to one common output, and the lower outputs are connected to another common output. These two common outputs are two inputs of the second switch circuit 320.

215 indicates 5 (=$2^2$+1) 2-input 1-output switch pairs which are controlled ON/OFF using bit4. Outputs of these five switch pairs 215 are voltages at the node n0, n1, n2, n3 and n4. 216 indicates 10 (=5×2) 2-input 1-output switch pairs which are controlled ON/OFF using bit5, and output 10 of the 17 reference voltages V0, V4, V8, . . . , and V64 received from the reference voltage generating circuit 100 to the switch pairs 215. These 15 switch pairs 215 and 216 each select one of two inputs in accordance with a corresponding bit of upper two bits (bit5 and bit4) of the 6-bit digital signal, and specifically, select the lower input if the corresponding bit is 0, and the upper input if the corresponding bit is 1.

As described above, the first switch circuit 210 comprises 19 switch pairs 211 to 216.

For example, if the four bits (bit5 to bit2) are "0000", the reference voltages V0, V4, V8, V12 and V16 appear at the five nodes n0, n1, n2, n3 and n4 in the first switch circuit 210, respectively. Of them, the lowest reference voltage V0 in the reference voltage generating circuit 100 is connected via 3(=6−2−2+1) MOS transistors to the second switch circuit 320, and the next lowest reference voltage V4 is connected via three other MOS transistors to the second switch circuit 320. In this case, Vin1=V0 and Vin2=V4.

If the four bits (bit5 to bit2) are "0001", the reference voltages V0, V4, V8, V12 and V16 appear at the five nodes n0, n1, n2, n3 and n4 in the first switch circuit 210, respectively. Of them, the reference voltage V4 is connected via three MOS transistors to the second switch circuit 320, and the next higher reference voltage V8 is connected via three other MOS transistors to the second switch circuit 320. In this case, Vin1=V4 and Vin2=V8.

If the four bits (bit5 to bit2) are "1111", the reference voltages V48, V52, V56, V60 and V64 appear at the five nodes n0, n1, n2, n3 and n4 in the first switch circuit 210, respectively. Of them, the reference voltage V60 is connected via three MOS transistors to the second switch circuit 320, and the highest reference voltage V64 is connected via three other MOS transistors to the second switch circuit 320. In this case, Vin1=V60 and Vin2=V64.

The second switch circuit 320 has a configuration similar to that of the second switch circuit 300 of FIG. 2. Note that, in FIG. 10, the number of MOS transistors M01 connected in series between the node n01 and the node n02, and the number of MOS transistors M02 connected in series between the node n02 and the node n03, are each 4 (=6−2−2+2). For example, if the four bits (bit5 to bit2) are "0000", and all of M00, M01, M02 and M03 are ON, a group of four ON-state MOS transistors is present between the reference voltage V0 and the node n01, between the node n01 and the node n02, between the node n02 and the node n03, and between the node n03 and the reference voltage V4. Therefore, the combined ON-resistances of these four MOS transistor groups connected in series to each other divide the difference between V0 and V4 into four, thereby obtaining three intermediate voltages. Note that the MOS transistor group between the reference voltage V0 and the node n01 includes three MOS transistors in the first switch circuit 210, and the MOS transistor group between the node n03 and the reference voltage V4 includes three other MOS transistors in the first switch circuit 210.

The third switch circuit 400, the voltage follower 500, and the logic circuit 600 have the same configurations as those which have been described in FIG. 2. Therefore, the operations of the second and third switch circuits 320 and 400 are similar to those of FIG. 3, and the whole operation of the DAC of FIG. 10 is similar to that of FIG. 4.

Note that, when lower three bits (bit4, bit3 and bit2) of the upper four bits of the 6-bit digital signal are decoded in the decoding circuit 620, 8 (=$2^3$) selection signals are obtained. Therefore, eight 2-input 2-output switch pairs which receive these selection signals and 9 (=$2^3$+1) 2-input 1-output switch pairs which are controlled ON/OFF using bit5, are provided in the first switch circuit 210. Therefore, in the second switch circuit 320, the number of MOS transistors M00 between the node n01 and the node n02, and the number of MOS transistors M02 between the node n02 and the node n03, are each 3 (=6−2−3+2).

Also, when all the upper four bits (bit5, bit4, bit3 and bit2) of the 6-bit digital signal are decoded in the decoding circuit 620, 16 (=$2^4$) selection signals are obtained. Therefore, sixteen 2-input 2-output switch pairs which receive the respective selection signals are provided in the first switch circuit 210. Therefore, in the second switch circuit 320, the number of MOS transistors M00 between the node n01 and the node n02, and the number of MOS transistors M02 between the node n02 and the node n03, are each 2 (=6−2−4+2).

Note that, as in the DAC of FIG. 2, the same number of MOS transistors may be added and connected in series to each of the four MOS transistor groups for dividing the difference between two reference voltages adjacent to each other of the 17 reference voltages V0, V4, V8, . . . , and V64 into four.

Also, in the DAC of FIG. 10, a variation similar to that of FIG. 9 is possible. As in FIG. 6, the DAC of FIG. 10 can be modified so as to divide a voltage into three.

FIG. 12 illustrates exemplary input-output characteristics of the DAC included in each source driver 25 of FIG. 1. A relationship between gray level data represented by an input digital signal and an output voltage represented by an output analog signal is linear in a middle region B, and nonlinear in both end regions A and C. A curve showing such characteristics is called a gamma curve.

Figure 13:
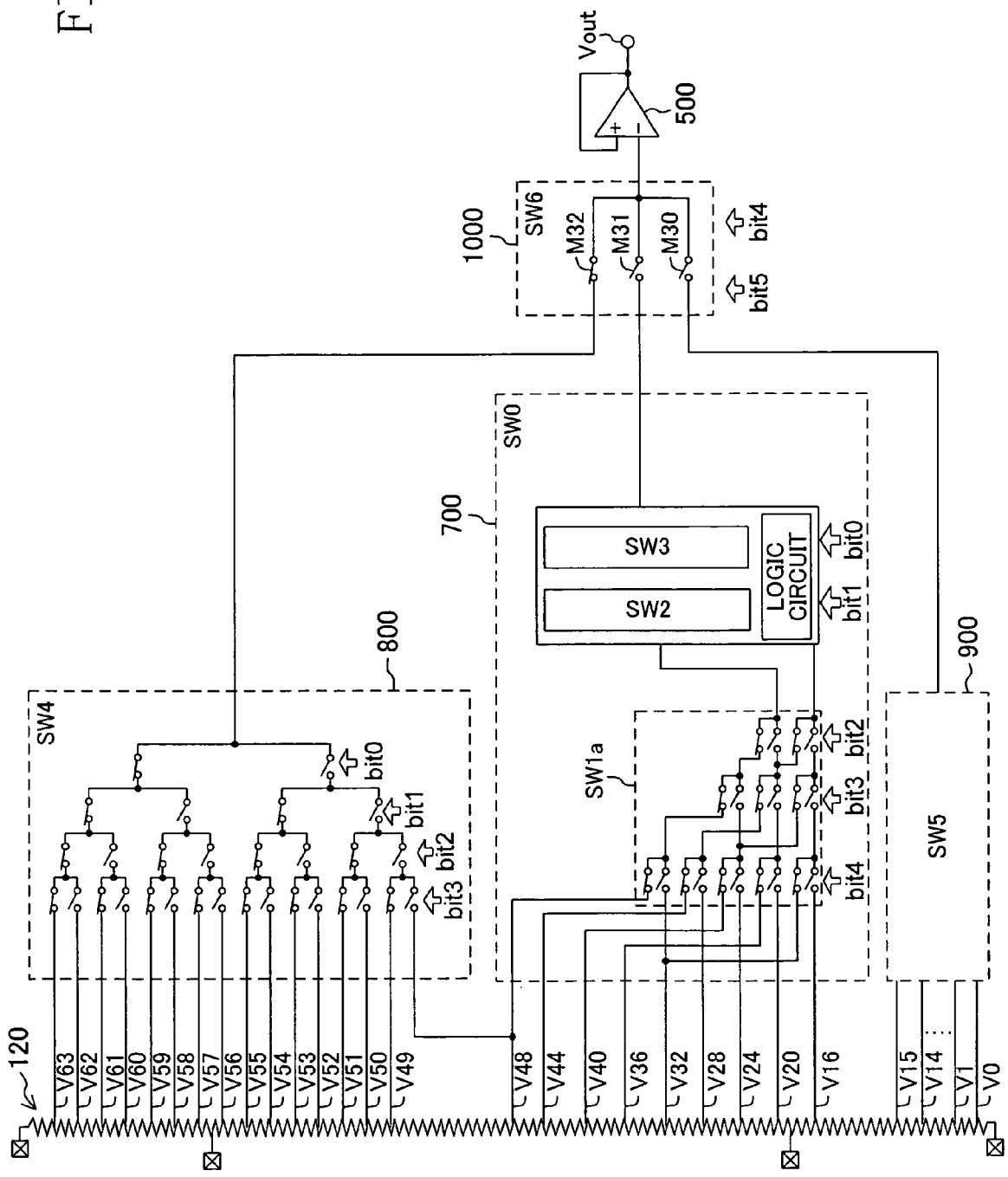
FIG. 13 is a circuit diagram illustrating still another exemplary configuration of the DAC of the present invention.

FIG. 13 illustrates still another exemplary configuration of the DAC of the present invention. The DAC of FIG. 13 is a converter for converting a digital signal represented by six bits (bit5 to bit0) into an analog signal Vout. In order to achieve the gamma curve of FIG. 12, the DAC of FIG. 13 comprises a reference voltage generating circuit 120, a combination switch circuit (SW0) 700 including first to third switch circuits (SW1a, SW2 and SW3) similar to those described above, a fourth switch circuit (SW4) 800, a fifth switch circuit (SW5) 900, a sixth switch circuit (SW6) 1000, and a voltage follower 500.

The reference voltage generating circuit 120 is a resistance voltage dividing circuit comprising resistance elements connected in series to each other. The reference voltage generating circuit 120 supplies 16 reference voltages V0 to V15 different from each other for achieving nonlinear characteristics to the fifth switch circuit 900, 9 reference voltages V16, V20, V24, . . . , and V48 different from each other for achieving linear characteristics to the combination switch circuit 700, and 16 reference voltages V48 to V63 different from each other for achieving nonlinear characteristics to the fourth switch circuit 800.

The combination switch circuit 700 comprises the first to third switch circuits and a logic circuit as in the DAC of FIG. 2. For an input range corresponding to the region B above, the combination switch circuit 700 receives lower five bits (bit4 to bit0) of a 6-bit digital signal, selects two reference voltages adjacent to each other of the 9 reference voltages V16, V20, V24, . . . , and V48 different from each other in accordance with three bits (bit4 to bit2), and outputs the lower one of the two selected reference voltages or any one of three intermediate voltages obtained by dividing the difference between the two selected reference voltages, in accordance bit1 and bit0.

The fourth switch circuit 800 comprises 15 switch pairs each of which selects one of two inputs in accordance with a corresponding bit of lower four bits (bit3 to bit0) of the 6-bit digital signal so as to select and output one of the 16 reference voltages V48 to V63 for an input range corresponding to the region C above.

The fifth switch circuit 900 has a configuration similar to that of the fourth switch circuit 800 so that one of the 16 reference voltages V0 to V15 is selected and output in accordance with the lower four bits (bit3 to bit0) of the 6-bit digital signal for an input range corresponding to the region A above.

The sixth switch circuit 1000 comprises a MOS transistor M31 which serves as a switch connected between the output of the combination switch circuit 700 and an input node of the voltage follower 500, a MOS transistor M32 which serves as a switch connected between the output of the fourth switch circuit 800 and the input node of the voltage follower 500, and a MOS transistor M30 which serves as a switch connected between the output of the fifth switch circuit 900 and the input node of the voltage follower 500. The sixth switch circuit 1000 receives the uppermost two bits (bit5 and bit4) of the 6-bit digital signal.

FIG. 14 illustrates an operation of the sixth switch circuit 1000 of FIG. 13. Specifically, if bit5 and bit4 are "00", the output of the fifth switch circuit 900 is selected and output to the input node of the voltage follower 500. If bit5 and bit4 are "01" or "10", the output of the combination switch circuit 700 is selected and output to the input node of the voltage follower 500. If bit5 and bit4 are "11", the output of the fourth switch circuit 800 is selected and output to the input node of the voltage follower 500.

FIGS. 15 to 17 illustrate the whole operation of the DAC of FIG. 11. FIG. 15 illustrates a contribution of the fifth switch circuit 900. FIG. 16 illustrates a contribution of the combination switch circuit 700. FIG. 17 illustrates a contribution of the fourth switch circuit 800.

As described above, according to the DAC of FIG. 13, the required gamma curve can be achieved while reducing the number of elements.

Note that the combination switch circuit 700 may comprise first to third switch circuits, a logic circuit, and a decoding circuit as in the DAC of FIG. 10.

Figure 18:
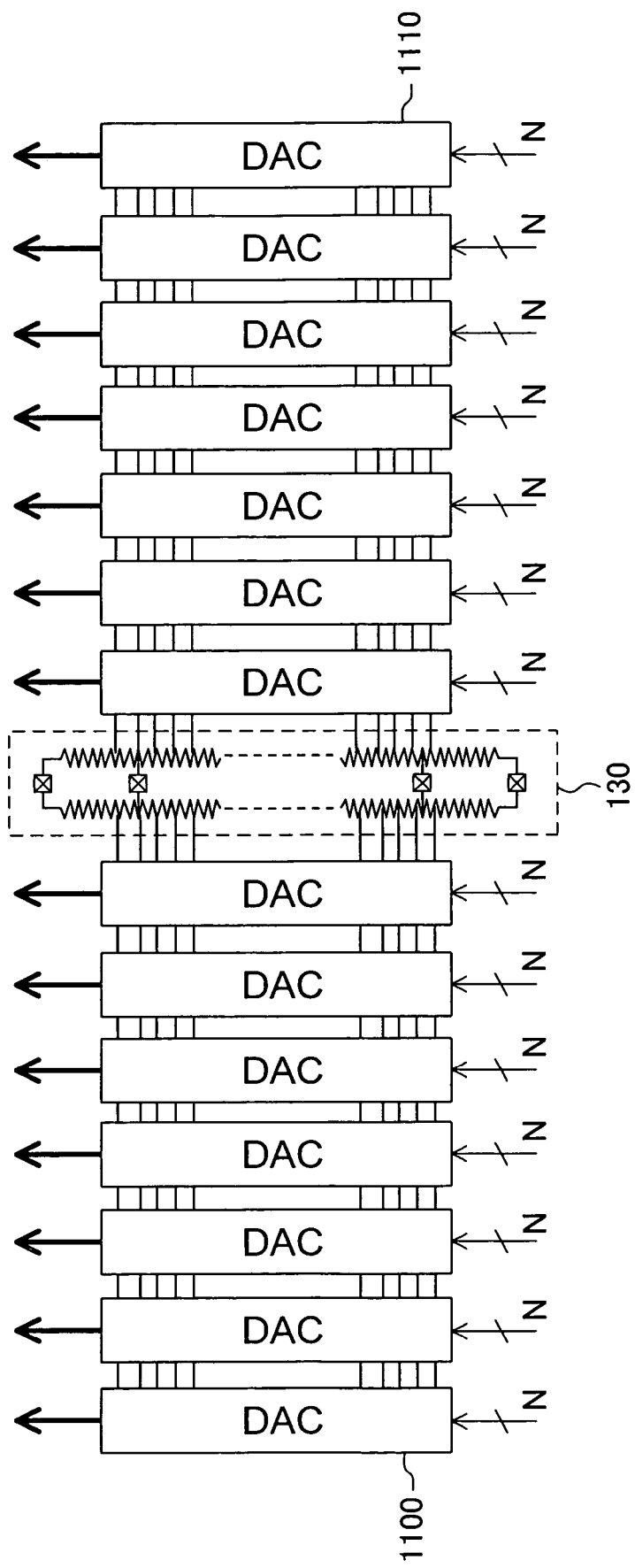
FIG. 18 is a block diagram illustrating an exemplary configuration of the reference voltage generating circuit of the image display apparatus of FIG. 1.

FIG. 18 illustrates an exemplary configuration of the reference voltage generating circuit of the image display apparatus 1 of FIG. 1. The reference voltage generating circuit 130 of FIG. 18 has two resistance voltage dividing circuits. One of the resistance voltage dividing circuits is used to supply a reference voltage to one half (DACs 1100) of all DACs, while the other resistance voltage dividing circuit is used to supply a reference voltage to the other half (DACs 1110). Thus, by reducing the load of each resistance voltage dividing circuit, it is possible to suppress a variation in the reference voltage. The DACs 1100 and 1110 are each any one of the above-described DACs. Particularly, the effect is significant when a number of DACs select the same set of two reference voltages (Vin1 and Vin2 above).

Figure 19:
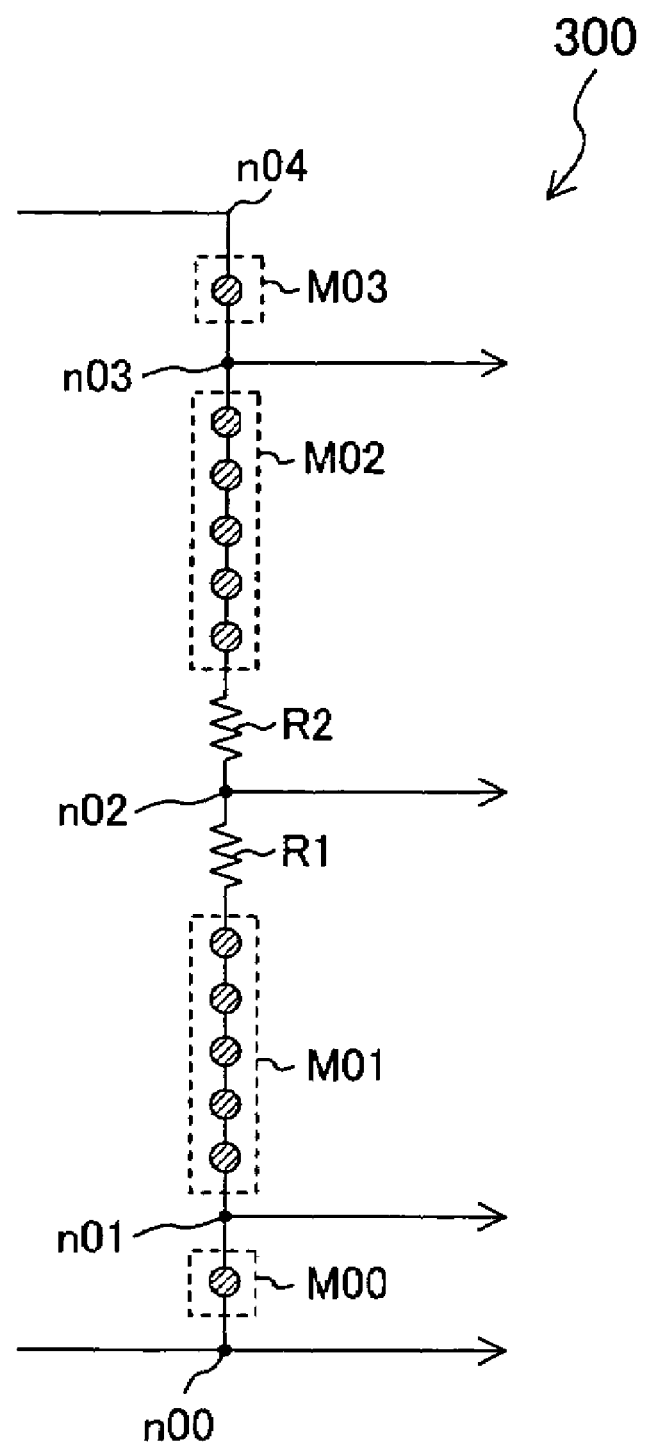
FIG. 19 is a conceptual diagram illustrating another variation of the second switch circuit of FIG. 2.

FIG. 19 shows another variation of the second switch circuit 300 of FIG. 2. In FIG. 19, a resistor R1 is inserted between the node n01 and the node n02 in addition to the five MOS transistors M01 while a resistor R2 is inserted between the node n02 and the node n03 in addition to the five MOS transistors M02. Referring to FIG. 18, the DAC remote from the reference voltage generating circuit 130 has long wirings for transmitting the reference voltages, and accordingly, the resistances thereof are high, resulting in invitation of lowering of the reference voltages to be received. In contrast, when the values of the resistors R1, R2 in FIG. 19 are set appropriately with the values of the wiring resistances taken into consideration, the lowering of the reference voltages due to the wiring resistances can be compensated. Registers for compensating the lowering of the reference voltages may be inserted in the above-described other DACs as in FIG. 6, FIG. 10, and the like.

As has been described above, according to the DAC of the present invention, the number of elements can be reduced while keeping the same resolution. The DAC of the present invention is useful for image display apparatuses, such as plasma displays and the like, as well as liquid crystal displays.

What is claimed is:

1. A converter for converting a digital signal having N bits (N is an integer of 3 or more) into an analog signal using a plurality of reference voltages different from each other, comprising:

a selective voltage dividing circuit having a plurality of MOS transistors functioning as switches, and for selecting two reference voltages of the plurality of reference voltages via the same number of MOS transistors of the plurality of MOS transistors in accordance with upper (N−m) bits of the digital signal, and dividing a difference between the two selected reference voltages into M using combined ON-resistances of M MOS transistor groups connected in series to each other of the plurality of MOS transistors to obtain (M−1) intermediate voltages, wherein M is any one of integers from $2^m$ to $2^{m-1}+1$ where m is an integer of 1 or more; and an output circuit for selectively outputting one of the two selected reference voltages or one of the (M−1) intermediate voltages in accordance with lower m bits of the digital signal.

2. The converter of claim 1, further comprising:

a reference voltage generating circuit for generating the plurality of reference voltages, wherein the reference voltage generating circuit has $2^{N-m}$ resistance elements connected in series to each other, and supplies ($2^{N-m}+1$) reference voltages different from each other from terminals of the resistance elements to the selective voltage dividing circuit.

3. The converter of claim 1, wherein the selective voltage dividing circuit has a switch circuit for selecting two reference voltages adjacent to each other from the plurality of reference voltages.

4. The converter of claim 3, wherein the switch circuit has a plurality of switch pairs each for selecting one of two inputs in accordance with a corresponding bit of upper (N−m) bits of the digital signal, the number of switch pairs $a_n$ corresponding to an n-th bit counted from the lowest bit of the upper (N−m) bits of the digital signal is given by:

$$a_1=2 \text{ and } a_n=a_{n-1}+2^{n-2}(2 \leq n \leq N-m), \text{ and}$$

the two reference voltages adjacent to each other are each selected via (N−m) MOS transistors of the MOS transistors constituting the plurality of switch pairs.

5. The converter of claim 4, wherein the M MOS transistor groups of the selective voltage dividing circuit each have (N−m+1) MOS transistors connected in series to each other, and two of the M MOS transistor groups each include (N−m) MOS transistors for selecting the two reference voltages adjacent to each other in the (N−m+1) MOS transistors connected in series to each other.

6. The converter of claim 3, wherein the selective voltage dividing circuit further has a decoding circuit for decoding lower P bits of upper (N−m) bits of the digital signal into $2^P$ selection signals any one of which is valid, where P is an integer of 2 or more and (N−m) or less, the switch circuit has:

$2^P$ switch pairs each for selectively transferring two inputs to two outputs in accordance with a corresponding one of the $2^P$ selection signals; and a plurality of other switch pairs each for selecting one of two inputs in accordance with a corresponding one of upper (N−m−P) bits of the digital signal, and the two reference voltages adjacent to each other are selected via (N−m−P+1) MOS transistors of the MOS transistors constituting all of the switch pairs.

7. The converter of claim 6, wherein each of the M MOS transistor groups in the selective voltage dividing circuit has (N−m−P+2) MOS transistors connected in series to each other, and two of the M MOS transistor groups each include (N−m−P+1) MOS transistors for selecting the two reference voltages adjacent to each other, of the (N−m−P+2) MOS transistors connected in series to each other.

8. The converter of claim 1, wherein the number of MOS transistors included in each of the M MOS transistor groups in the selective voltage dividing circuit is set so that the M MOS transistor groups have the same combined ON-resistance.

9. The converter of claim 1, wherein sizes of MOS transistors included in each of the M MOS transistor groups in the selective voltage dividing circuit are set so that the M MOS transistor groups have the same combined ON-resistance.

10. The converter of claim 1, wherein the output circuit further has a function of outputting the other of the two selected reference voltages as the analog signal.

11. A digital-to-analog converter for converting a digital signal into an analog signal, comprising:
   a reference voltage generating circuit for generating a plurality of reference voltages different from each other;
   a first converter for selecting two reference voltages adjacent to each other of the plurality of reference voltages for a predetermined input range of the digital signal, and outputting one of the two selected reference voltages or an intermediate voltage obtained by dividing a difference between the two selected reference voltages; and
   a second converter for selecting one of the plurality of reference voltages for another input range of the digital signal, and outputting the selected reference voltage,
   wherein the first converter is the converter of claim 1.

12. The digital-to-analog converter of claim 11, wherein the first converter has linear input-output characteristics, and the second converter has nonlinear input-output characteristics.

13. An image display apparatus comprising:
   a display panel having a plurality of pixels; and
   a drive circuit for driving the plurality of pixels in accordance with a digital signal indicating a gray level of an image,
   wherein the drive circuit comprises:
      a reference voltage generating circuit for generating a plurality of reference voltages different from each other; and
      a plurality of digital-to-analog converters for converting the digital signal indicating the gray level of the image into an analog signal for each pixel column using the plurality of reference voltages,
   each of the plurality of digital-to-analog converters is the converter of claim 1.

14. The image display apparatus of claim 13, wherein the reference voltage generating circuit has a plurality of resistance voltage dividing circuits share the load of supplying a reference voltage to a portion of the converters for the pixel columns.

* * * * *